United States Patent
Wu et al.

(10) Patent No.: US 12,080,808 B2
(45) Date of Patent: Sep. 3, 2024

(54) CROSS-COUPLED GATED TUNNEL DIODE (XTD) DEVICE WITH INCREASED PEAK-TO-VALLEY CURRENT RATIO (PVCR)

(71) Applicant: Purdue Research Foundation, West Lafayette, IN (US)

(72) Inventors: Peng Wu, Cambridge, MA (US); Joerg Appenzeller, West Lafayette, IN (US)

( * ) Notice: Subject to any disclaimer, the term of this patent is extended or adjusted under 35 U.S.C. 154(b) by 92 days.

(21) Appl. No.: 17/690,417

(22) Filed: Mar. 9, 2022

(65) Prior Publication Data

US 2023/0290891 A1     Sep. 14, 2023

(51) Int. Cl.
*H01L 29/88* (2006.01)
*H10B 10/00* (2023.01)

(52) U.S. Cl.
CPC ............. *H01L 29/88* (2013.01); *H10B 10/00* (2023.02)

(58) Field of Classification Search
CPC ....... H01L 29/404; H01L 29/88; H10B 10/00; H10B 99/16
See application file for complete search history.

(56) References Cited

U.S. PATENT DOCUMENTS 9,437,752 B2 * 9/2016 Berger ............... H01L 29/66151
2010/0271851 A1 * 10/2010 Ankoudinov ......... H01L 29/861
363/126

OTHER PUBLICATIONS

Appenzeller, J. et al.,"Band-to-Band Tunneling in Carbon Nanotube Field-Effect Transistors," Physical Review Letters, vol. 93, No. 19, Nov. 2004, The American Physical Society, 4 pages.
Avci, U. et al., "Study of TFET non-ideality effects for determination of geometry and defect density requirements for sub-60mV/dec Ge TFET," 2015 IEEE International Electron Devices Meeting (IEDM), Dec. 7-9, 2015, Washington, DC, USA, IEEE, 4 pages.
Bogumilowicz, Y. et al., "SiGe virtual substrates growth up to 50% Ge concentration for Si/Ge dual channel epitaxy," Materials Science and Engineering: B, vols. 124-125, Dec. 2005, Elsevier, 5 pages.

(Continued)

*Primary Examiner* — Meiya Li
(74) *Attorney, Agent, or Firm* — Withrow & Terranova, P.L.L.C.

(57) ABSTRACT

A cross-coupled tunnel diode (XTD) device with large peak-to-valley current ratio (PVCR) is disclosed. A memory cell circuit comprising XTD devices is also disclosed. The XTD device includes an N-type semiconductor coupled to a P-type semiconductor. A first gate is disposed on the N-type semiconductor and a second gate is disposed on the P-type semiconductor. The first gate is coupled to the output terminal, which is further coupled to the P-type semiconductor. The second gate is coupled to the input terminal, which is coupled to the N-type semiconductor. As reverse bias voltage increases, band-to-band tunneling from valence band to conduction band initially generates increasing current, but the rising bias voltage closes the band to band tunneling window, creating a gated negative differential resistance behavior. The current drops off as the bias voltage further increases. In some examples, a ratio of peak-to-valley current ratio may exceed $10^3$ or $10^5$.

21 Claims, 5 Drawing Sheets

(56) References Cited

OTHER PUBLICATIONS

Chynoweth, A.G. et al., "Excess Tunnel Current in Silicon Esaki Junctions," Physical Review, vol. 121, No. 3, Feb. 1961, 11 pages.

Convertino, C. et al., "A hybrid III-V tunnel FET and MOSFET technology platform integrated on silicon," Nature Electronics, vol. 4, No. 2, Feb. 2021, 9 pages.

Das, S. et al., "Toward Low-Power Electronics: Tunneling Phenomena in Transition Metal Dichalcogenides," ACS Nano, vol. 8, No. 2, Feb. 2014, 18 pages.

Esaki, L., "New Phenomenon in Narrow Germanium p-n Junctions," Physical Review, vol. 109, No. 2, Jan. 1958, 2 pages.

Fischetti, M.V. et al., "Band structure, deformation potentials, and carrier mobility in strained Si, Ge, and SiGe alloys," Journal of Applied Physics, vol. 80, No. 4, Aug. 1996, 20 pages.

Goto, E. et al., "Esaki Diode High-Speed Logical Circuits," IRE Transactions on Electronic Computers, vol. EC-9, Issue 1, Mar. 1960, IEEE, pp. 25-29.

Knoch, J. et al., "Tunneling phenomena in carbon nanotube field-effect transistors," Physica Status Solidi A, vol. 205, No. 4, Apr. 2008, Wiley-VCH Verlag GmbH & Co. KGaA, 17 pages.

Memisevic, E. et al., "Vertical InAs/GaAsSb/GaSb tunneling field-effect transistor on Si with S=48 mV/decade and Ion=10 μA/μm for Ioff=1 nA/μm at Vds=0.3 V," 2016 IEEE International Electron Devices Meeting (IEDM), Dec. 3-7, 2016, San Francisco, CA, USA, IEEE, 4 pages.

Meyerhofer, D. et al., "Degenerate Germanium. I. Tunnel, Excess, and Thermal Current in Tunnel Diodes," Physical Review, vol. 126, No. 4, May 1962, 13 pages.

Riel, H. et al., "InAs—Si heterojunction nanowire tunnel diodes and tunnel FETs," 2012 International Electron Devices Meeting, Dec. 2012, San Francisco, CA, IEEE, 4 pages.

Robbins, M.C. et al., "Crystal-oriented black phosphorus TFETs with strong band-to-band-tunneling anisotropy and subthreshold slope nearing the thermionic limit," 2017 IEEE International Electron Devices Meeting (IEDM), Dec. 2-6, 2017, San Francisco, CA, USA, IEEE, 4 pages.

Roy, T. et al., "2D-2D tunneling field-effect transistors using WSe2/SnSe2 heterostructures," Applied Physics Letters, vol. 108, No. 8, Feb. 2016, AIP Publishing LLC, 6 pages.

Roy, T. et al., "Dual-Gated MoS2/WSe2 van der Waals Tunnel Diodes and Transistors," ACS Nano, vol. 9, No. 2, Feb. 2015, American Chemical Society, 15 pages.

Sant, S. et al., "Impact of trap-assisted tunneling and channel quantization on InAs/Si hetero Tunnel FETs," 2016 74th Annual Device Research Conference (DRC), Jun. 19-22, 2016, Newark, DE, USA, IEEE, 2 pages.

Schenk, A., "A model for the field and temperature dependence of Shockley-Read-Hall lifetimes in silicon," Solid-State Electronics, vol. 35, No. 11, Nov. 1992, Elsevier, 12 pages.

Smets, Q. et al., "Calibration of Bulk Trap-Assisted Tunneling and Shockley-Read-Hall Currents and Impact on InGaAs Tunnel-FETs," IEEE Transactions on Electron Devices, vol. 64, No. 9, Sep. 2017.

Sutar, S. et al., "InAlAs/InGaAs Interband Tunnel Diodes for SRAM," IEEE Transactions on Electron Devices, vol. 57, No. 10, Oct. 2010, IEEE, 7 pages.

Synopsys, Inc., "Sentaurus Device User Guide," Version G-2012.06, Jun. 2012, 1368 pages.

Teherani, J. et al., "Extraction of large valence-band energy offsets and comparison to theoretical values for strained-Si/strained-Ge type-II heterostructures on relaxed SiGe substrates," Physical Review B, vol. 85, No. 20, May 2012, American Physical Society, 10 pages.

Van Der Wagt, P. et al., "RTD/HFET low standby power SRAM gain cell," IEEE Electron Device Letters, vol. 19, No. 1, Jan. 1998, IEEE, 3 pages.

Van Der Wagt, P. et al., "Tunneling-based SRAM," Nanotechnology, vol. 10, 1999, IOP Publishing, 14 pages.

Wu, P. et al., "Complementary Black Phosphorus Tunneling Field-Effect Transistors," ACS Nano, vol. 13, No. 1, Dec. 2018, American Chemical Society, 23 pages.

Wu, P. et al., "Reconfigurable Black Phosphorus Vertical Tunneling Field-Effect Transistor With Record High ON-Currents," IEEE Electron Device Letters, vol. 40, No. 6, Jun. 2019, IEEE, 4 pages.

Yan, R. et al., "Esaki Diodes in van der Waals Heterojunctions with Broken-Gap Energy Band Alignment," Nano Letters, vol. 15, No. 9, Jul. 2015, American Chemical Society, 8 pages.

Zhao, Q.-T. et al., "Strained Si and SiGe Nanowire Tunnel FETs for Logic and Analog Applications," IEEE Journal of the Electron Devices Society, vol. 3, Issue 3, May 2015, online Apr. 2015, IEEE, 13 pages.

\* cited by examiner

CROSS-COUPLED GATED TUNNEL DIODE (XTD) DEVICE WITH INCREASED PEAK-TO-VALLEY CURRENT RATIO (PVCR)

GOVERNMENT SUPPORT

This invention was made with government support under NIST Award No. 70NANB17H041 (NIST is the National Institute of Standards and Technology, a unit of the U.S. Commerce Department). The government has certain rights in the invention.

BACKGROUND

I. Field of the Disclosure

The technology of the disclosure relates generally to diodes and, in particular, to tunneling diodes providing negative differential resistance over a bias voltage range.

II. Background

Computing devices abound in modern society, and more particularly, mobile communication devices have become increasingly common. The prevalence of mobile communication devices is driven in part by the many functions made available in such devices by semiconductor processing circuits.

Increased processing capabilities in such devices means that mobile communication devices have evolved from pure communication tools into sophisticated mobile entertainment centers, thus enabling enhanced user experiences. There is ongoing pressure to develop semiconductor circuits, such as memory circuits, that are smaller and more energy-efficient than those available in existing technologies to further increase the myriad functions of such devices. This demand for smaller and more energy-efficient circuits is not just applicable to mobile communication devices. Most modern computing devices are also expected to become smaller and more energy-efficient.

Thus, there is a need for semiconductor devices that provide certain electrical characteristics with energy efficiency in a small size. A tunnel diode is one example of a semiconductor device that can be used in several types of circuits, including oscillators, amplifiers, switching circuits, and memory circuits. Tunnel diodes have the property of negative differential resistance (NDR), which means that, as an applied bias voltage on a tunnel diode increases within the limited range, a current conducted through the tunnel diode decreases. Esaki tunnel diodes are an example of a device that exhibits NDR in a limited voltage range. However, Esaki tunnel diodes are not widely used in integrated circuits because they have a high standby power due, in part, to a non-ideal NDR. Esaki tunnel diodes also suffer from a large leakage current at voltages above the NDR range. Thus, existing tunnel diodes provide a beneficial electrical characteristic but are of limited use and energy efficiency.

SUMMARY

Aspects disclosed in the detailed description include a cross-coupled gated tunnel diode (XTD) device providing an increased peak-to-valley current ratio (PVCR). A memory cell circuit comprising XTD devices is also disclosed. The XTD device includes an N-type semiconductor coupled to a P-type semiconductor and cross-coupled gates to enable electron tunneling in response to a reverse bias and produce a negative differential resistance (NDR) with a high peak-to-valley current ratio. In an exemplary aspect, an input terminal of the XTD device is coupled to the N-type semiconductor, and an output terminal is coupled to the P-type semiconductor. A first gate disposed on the N-type semiconductor is coupled to the P-type semiconductor, and a second gate disposed on the P-type semiconductor is coupled to the N-type semiconductor. A current conducted through the XTD device decreases with an increasing bias voltage that causes the gated regions to become depleted, creating a gated negative differential resistance (gated-NDR) effect over a voltage range. In some examples, a peak current at a low voltage end of the NDR range and a minimum current at a high voltage end of the NDR range have a ratio of at least $1 \times 10^3$. In some examples, the ratio of peak current to minimum current is at least $1 \times 10^5$.

In this regard, in one aspect, a tunnel diode device is disclosed. The tunnel diode device comprises a P-type semiconductor coupled to an N-type semiconductor, a first gate disposed on the N-type semiconductor, the first gate coupled to the P-type semiconductor, and a second gate disposed on the P-type semiconductor, the second gate coupled to the N-type semiconductor. The tunnel diode also includes an input terminal coupled to the N-type semiconductor and an output terminal coupled to the P-type semiconductor.

In another aspect, a memory cell circuit is disclosed. The memory cell circuit comprises a first tunnel diode device coupled between a supply voltage node and a storage node, a second tunnel diode device coupled between the storage node and a reference voltage node, and a switch coupled between a bit line and the storage node. In the memory cell circuit, each of the first tunnel diode device and the second tunnel diode device comprises a P-type semiconductor coupled to an N-type semiconductor, a first gate disposed on the N-type semiconductor, the first gate coupled to the P-type semiconductor, and a second gate disposed on the P-type semiconductor, the second gate coupled to the N-type semiconductor. Each of the first tunnel diode device and the second tunnel diode device further comprises an input terminal coupled to the N-type semiconductor an output terminal coupled to the P-type semiconductor.

DETAILED DESCRIPTION

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include a cross-coupled gated tunnel diode (XTD) device providing an increased peak-to-valley current ratio (PVCR). A memory cell circuit comprising XTD devices is also disclosed. The XTD device includes an N-type semiconductor coupled to a P-type semiconductor and cross-coupled gates to enable electron tunneling in response to a reverse bias and produce a negative differential resistance (NDR) with a high peak-to-valley current ratio. In an exemplary aspect, an input terminal of the XTD device is coupled to the N-type semiconductor, and an output terminal is coupled to the P-type semiconductor. A first gate disposed on the N-type semiconductor is coupled to the P-type semiconductor, and a second gate disposed on the P-type semiconductor is coupled to the N-type semiconductor. A current conducted through the XTD device decreases with an increasing bias voltage that causes the gated regions to become depleted, creating a gated negative differential resistance (gated-NDR) effect over a voltage range. In some examples, a peak current at a low voltage end of the NDR range and a minimum current at a high voltage end of the NDR range have a ratio of at least $1\times10^3$. In some examples, the ratio of peak current to minimum current is at least $1\times10^5$.

To facilitate a description of the XTD device provided below with reference to FIGS. 4-7 and highlight distinctive features relative to a conventional tunnel diode, a discussion of a conventional tunnel diode is first provided with reference to FIGS. 1-3.

Figure 1:
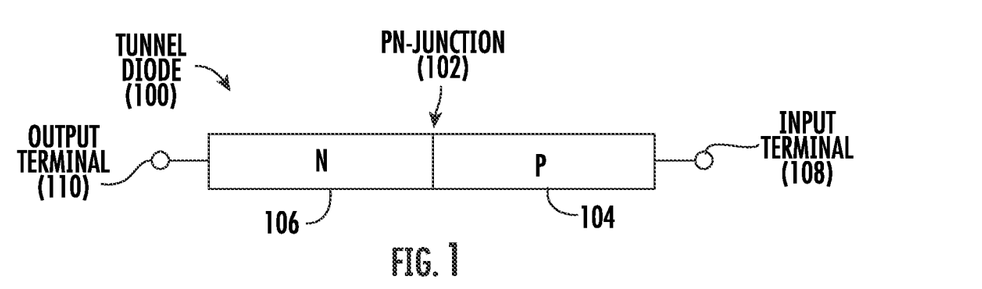
FIG. 1 is a block diagram of a conventional tunnel diode with negative differential resistance (NDR) in a limited voltage range.

FIG. 1 is a block diagram of an Esaki tunnel diode 100, which became known because of its NDR behavior over a limited voltage range. The tunnel diode 100 is based on a PN-junction 102 at which a semiconductor that is degenerately doped with P-type material (e.g., a P-type semiconductor 104) is coupled to a semiconductor that is degenerately doped with N-type material (N-type semiconductor 106). The PN-junction 102 may be a heterojunction or a homojunction. The tunnel diode 100 includes an input terminal 108 coupled to the P-type semiconductor 104 and an output terminal 110 coupled to the N-type semiconductor 106. A bias voltage V is a positive voltage applied between the input terminal 108 and the output terminal 110. As the bias voltage V increases, a current I is conducted through the tunnel diode 100, and the current increases as the bias voltage V increases. This behavior is illustrated in FIG. 2.

Figure 2:
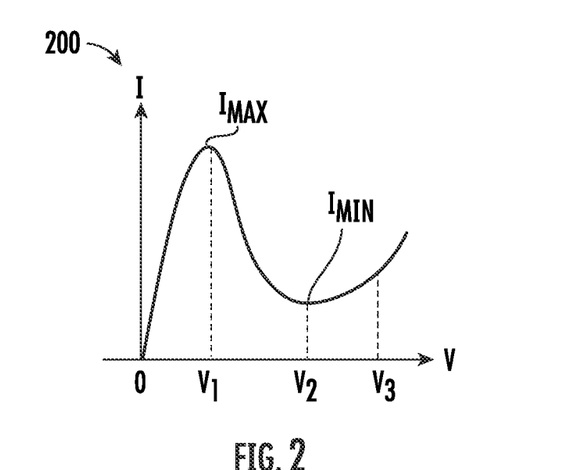
FIG. 2 is graph of current conducted over a range of applied bias voltage that includes negative differential resistance behavior in the conventional tunnel diode of FIG. 1.
Figure 3:
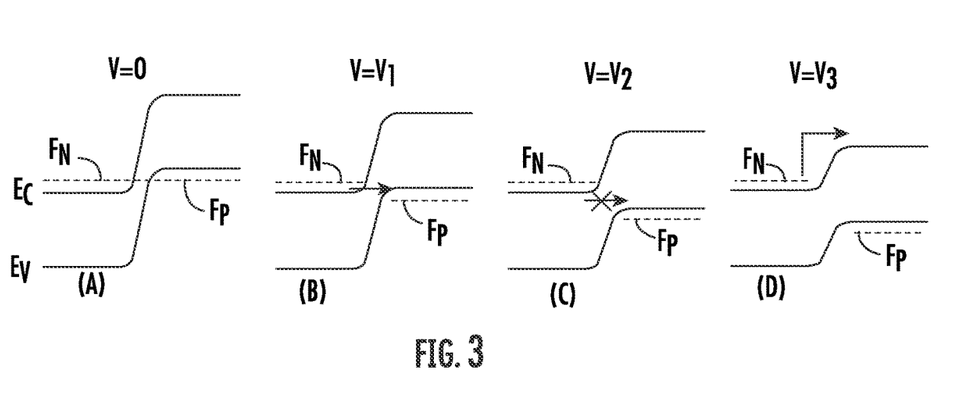
FIGS. 3(A)-3(D) are band diagrams showing energy bands and Fermi levels across a PN-junction of the conventional tunnel diode in FIG. 1 in a range of voltage levels.

FIG. 2 is graph 200 of the current I over a range of the applied bias voltage V, which includes NDR behavior in the Esaki tunnel diode 100 in FIG. 1. Following a description of the operational characteristics of the tunnel diode 100 with reference to FIG. 2, a brief technical discussion of the reasons for these operational characteristics will be explained below with reference to FIGS. 3(A)-3(D).

Without an applied bias voltage V (e.g., V=0), there is no current through the tunnel diode 100, and the PN-junction 102 is at equilibrium. As the bias voltage V increases, the current I through the tunnel diode 100 also increases until the current I reaches a maximum or peak current $I_{MAX}$ at a bias voltage V1. As the bias voltage continues to increase from V1 to V2, the current I initially decreases sharply. The decrease in the current I becomes more gradual as the bias voltage V approaches V=V2. This decrease in current I corresponding to an increase in the bias voltage V is the NDR behavior of a tunnel diode. At bias voltage V2, the decrease in current I stops at a minimum current $I_{MIN}$. The minimum current $I_{MIN}$ is in the range of one-tenth of the maximum current $I_{MAX}$ (e.g., $I_{MAX}=10\times I_{MIN}$ or $I_{MIN}=I_{MAX}\times 10^{-1}$). As the applied bias voltage V further increases from V2 to V3 and higher, the current I again begins to increase.

FIGS. 3(A)-3(D) are band diagrams showing energy band levels $E_V$ and $E_C$, and Fermi levels FN and FP on both sides of the PN-junction 102 of the Esaki tunnel diode 100 in FIG. 1 corresponding to the bias voltage V at 0 volts, V1, V2, and V3 in FIG. 2. FIGS. 3(A)-3(D) are described with reference to the tunnel diode 100 in FIG. 1. The band level $E_C$ indicates the minimum allowed energy of electrons in the conduction bands of the P-type semiconductor 104 (right), the N-type semiconductor 106 (left), and at the PN-junction 102 (center). The band level $E_V$ indicates the maximum allowed energy of valence band electrons. The dashed lines FN and FP indicate Fermi levels, which indicate points above which an energy level is unlikely to be occupied and below which an energy level is likely to be occupied. At equilibrium (e.g., bias voltage V=0), the Fermi level FN is equal to the Fermi level FP.

When the bias voltage V of the tunnel diode 100 increases from zero, electrons are subjected to an electric field that draws them from the N-type semiconductor 106 to the P-type semiconductor 104. In addition, Fermi level FP in the P-type semiconductor moves lower, allowing the electrons from the N-type semiconductor 106 to tunnel into the empty states in the valence band of the P-type semiconductor 104. Another effect of the bias voltage V is to make the energy level $E_V$ of the valence band in the P-type semiconductor 104 lower relative to the energy level $E_C$ of the conduction band in the N-type semiconductor 106, in this way increasing the current. This effect increases until the bias voltage V reaches a certain point, V=V1. At a bias voltage V greater than V1, the conduction band of the N-type semiconductor 106 and the valence band of the P-type semiconductor 104 become misaligned, and the band-to-band tunneling (BTBT) window becomes narrower with increasing voltage, causing the current I to drop and leading to the NDR behavior. As the bias voltage V further increases, the current I rises again due to increasing thermionic emission over the barrier of the PN-junction 102.

Referring back to FIG. 2, the increase in current I as the bias voltage V increases from 0 to V1 is due to the tunneling effect of electrons from the conduction band of the N-type semiconductor 106 to the valence band of the P-type semiconductor 104. As the bias voltage V further increases from V1 to V2, the window of overlap between the conduction band of the N-type semiconductor 106 and the valence band of the P-type semiconductor 104 becomes narrower and eventually closes to provide the NDR behavior. As the bias voltage V continues to increase above V2, electron flow begins again, but here it is due to thermionic emission, not tunneling. This effect provides an increasing current I as the bias voltage V increases above the bias voltage V=V2. Thus, the different regions of increasing current I (from V=0 to V=V1 and above V=V2) are due to different mechanisms acting in the PN-junction 102.

Figure 4:
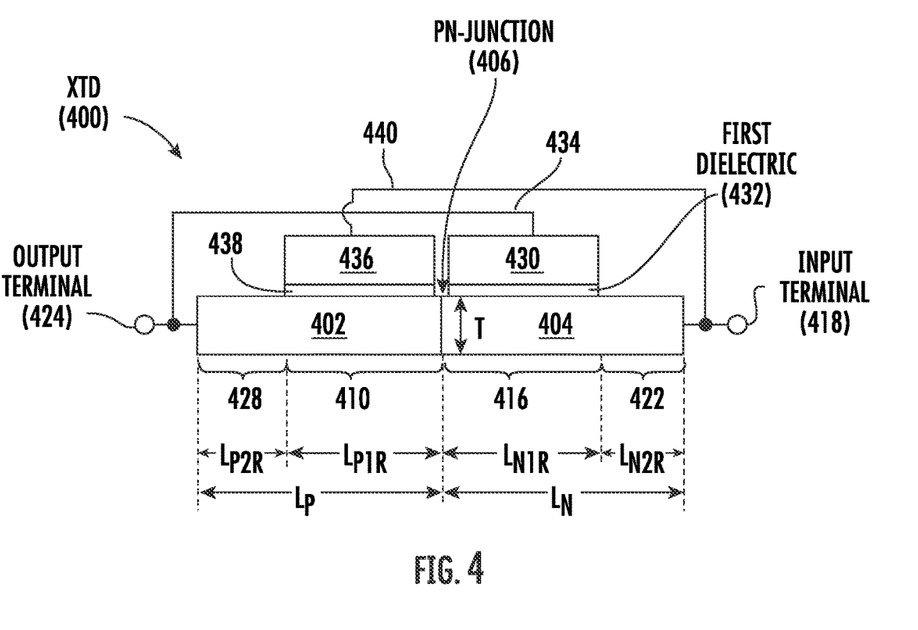
FIG. 4 is a block diagram of an exemplary cross-coupled tunnel diode (XTD) device with a gated N-type semiconductor coupled to a gated P-type semiconductor for increased peak-to-valley current ratio (PVCR)

FIG. 4 is a block diagram of an exemplary cross-coupled tunnel diode (XTD) device 400 with a P-type semiconductor 402 coupled to an N-type semiconductor 404. The P-type semiconductor 402 and the N-type semiconductor 404 are each gated and cross-coupled to each other to provide a gated NDR effect with a larger peak-to-valley current ratio (PVCR). Functional aspects of the XTD device 400 described below will be better understood based on the following introduction of the structural features of the XTD device 400.

The XTD device 400 in FIG. 4 includes a PN-junction 406 (e.g., heterojunction) formed at an intersection of the P-type semiconductor 402 and the N-type semiconductor 404. The PN-junction 406 is formed between a first region 410 of the P-type semiconductor 402 and a first region 416 of the N-type semiconductor 404. In an exemplary aspect, an input terminal 418 of the XTD device 400 is coupled to a second region 422 of the N-type semiconductor 404, and an output terminal 424 is coupled to a second region 428 of the P-type semiconductor 402. The XTD device 400 operates in the reverse bias direction. Positive voltages are applied to the N-type semiconductor 404 relative to the P-type semiconductor 402.

In another exemplary aspect, the XTD device 400 includes a first gate 430 disposed on the N-type semiconductor 404 with a first dielectric layer 432 between the first gate 430 and the N-type semiconductor 404. The first gate 430 is disposed on the first region 416 of the N-type semiconductor 404, and the first gate 430 is coupled to the P-type semiconductor 402 by a first metal interconnect 434. The XTD device 400 also includes a second gate 436 disposed on the P-type semiconductor 402 with a second dielectric layer 438 between the second gate 436 and the P-type semiconductor 402. The second gate 436 is disposed on the first region 410 of the P-type semiconductor 402, and the second gate 436 is coupled to the N-type semiconductor 404 by a second metal interconnect 440. The first gate 430 and the second gate 436 may be metal or polysilicon or any other material known in the art. The dielectric layers 432, 438 may be silicon dioxide, hafnium oxide, or any dielectric material known in the art.

The P-type semiconductor 402 and the N-type semiconductor 404 may each be formed having a thickness T, which may be in a range of one half (0.5) of a nanometer (nm) to ten (10) nm. In some examples, the P-type semiconductor 402 and the N-type semiconductor 404 may be formed as layers having a thickness of four (4) nm on a substrate to which the layers are lattice-matched or may be formed by doping a thickness of four (4) nm in a surface of a semiconductor substrate. The P-type semiconductor 402 and the N-type semiconductor 404 are thin enough to ensure that the first gate 430 can deplete the first region 416 of the N-type semiconductor 404 and the second gate 436 can deplete the first region 410 of the P-type semiconductor 402, respectively, in response to the voltages on the input terminal 418 and the output terminal 424, to provide the "gated NDR" function of the XTD device 400. The P-type semiconductor 402 has a length LP in the X-axis direction, and the N-type semiconductor 404 has a length $L_N$, which may be similar to LP. The lengths LP and $L_N$ may each be in a range of forty (40) nm to sixty (60) nm, and in some examples, they may both be fifty (50) nm. A length $L_{N1R}$ of the first region 416 and the length $L_{N2R}$ of the second region 422 of the N-type semiconductor 404 may be the same or similar to the length $L_{P1R}$ of the first region 410 and the length $L_{P2R}$ of the second region 428 of the P-type semiconductor region.

In some examples, the P-type semiconductor 402 may be P-doped strained germanium (Ge), and the N-type semiconductor 404 may be N-doped strained silicon (Si). In such examples, P-type semiconductor 402 and the N-type semiconductor 404 may be doped with lower concentrations of dopants than the N-type semiconductor and the P-type semiconductor of an Esaki diode. Other materials known in the art for use in PN junctions are within the scope of this disclosure.

Operational characteristics of the XTD device 400 are now described with reference to FIGS. 5 and 6.

Figure 5:
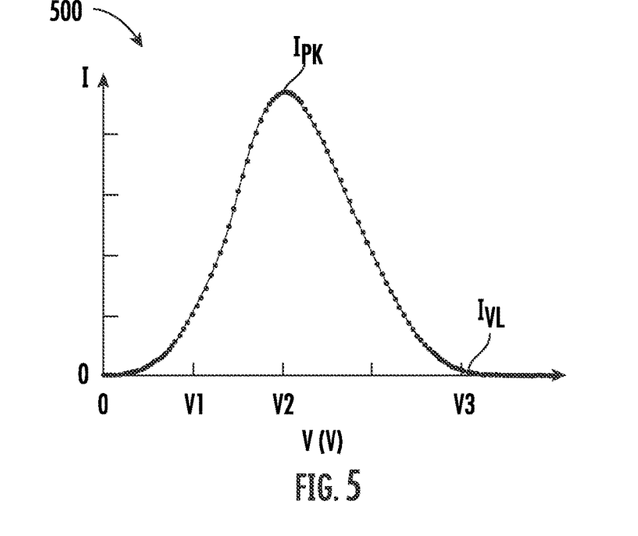
FIG. 5 is a graph of current conducted over a range of applied bias voltage that includes an NDR region in the XTD device in FIG. 4.
Figure 6:
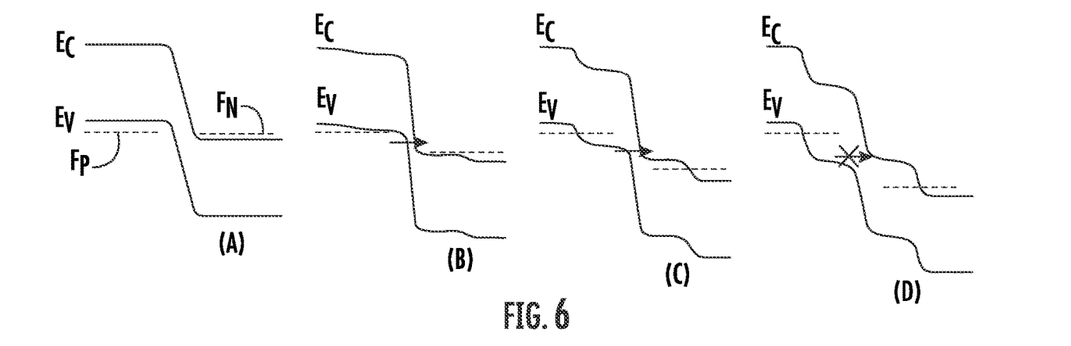
FIGS. 6(A)-6(D) are band diagrams showing energy bands and Fermi levels across a PN-junction in the XTD device in FIG. 4A in a range of voltage levels.

FIG. 5 is a graph of current I conducted over a range of applied bias voltages V that includes an NDR region in the XTD device 400 in FIG. 4. At a bias voltage V=0, the PN-junction 406 is at equilibrium such that no current I flows. As the bias voltage V is increased from zero (0) to V1 (e.g., 0.2 volts), the current I increases slowly. As the bias voltage V is further increased from V1 to V2 (e.g., 0.4 volts), the current I increases more sharply and may have a near-linear rate of increase in the current I until the current I gets close to a peak (e.g., maximum) current $I_{PK}$. As an example, the peak current $I_{PK}$ may be twenty-five (25) microamperes (μA) per micron (μm) of the width of the PN-junction 406.

As the bias voltage V is increased from V2 to V3, the current I decreases. At the bias voltage V=V3, the current I approaches a valley (e.g., low) current $I_{VAL}$ that is less than $I_{PK} \times 10^{-3}$. In some examples, the valley current $I_{VAL}$ is less than $I_{PK} \times 10^{-5}$. Stated differently, the peak-to-valley current ratio (PVCR) of the peak current $I_{PK}$ to the valley current $I_{VAL}$ is at least $10^3$ ($I_{PK}/I_{VAL} > 10^3$). In some examples, the PVCR is greater than 100,000 (i.e., $I_{PK}/I_{VAL} > 10^5$). The XTD device 400 exhibits a PVCR of at least $10^4$ in a temperature range up to at least 100 degrees Celsius (100° C.).

The operation of the PN-junction 406 of the XTD device 400 is further described with reference to diagrams 6(A)-6(D) and the features illustrated in FIG. 4. The diagrams 6(A)-6(D) correspond to bias voltages V of 0, V1, V2, and V3 shown in the graph 500 in FIG. 5. In this configuration, a positive bias voltage V on the input terminal 418 relative to the output terminal 424 provides a bias voltage on the PN-junction 406 that is in the reverse polarity compared to the PN-junction 102 on the tunnel diode 100. It is first noted that in a reverse-biased PN-junction without the first gate 430 and the second gate 436, the band-to-band tunneling (BTBT) window becomes larger, and the space between the Fermi levels FN and FP increases with increasing bias voltage, causing the current I to also increase. In this case, no NDR behavior would be observable.

At equilibrium (i.e., with a bias voltage V=0), there is no current flow. As the bias voltage V increases, BTBT occurs from the valence band of the P-type semiconductor 402 to the conduction band of the N-type semiconductor 404. However, with the first gate 430 disposed on the N-type semiconductor 404 and coupled to the P-type semiconductor 402, and the second gate 436 disposed on the P-type semiconductor 402 and coupled to the N-type semiconductor 404, the positive bias voltage V provided to the input terminal 418 is also provided to the second gate 436 on the P-type semiconductor 402. A relatively lower voltage (e.g., a reference voltage or ground) on the output terminal 424 is provided to the first gate 430 on the N-type semiconductor 404. As a result, current I will initially flow as the bias voltage V increases from V=0, but the first region 410 of the P-type semiconductor 402 and the first region 416 of the N-type semiconductor 404 will be increasingly depleted as the applied bias voltage V increases, and the BTBT window will gradually narrow and close (seen in the progression in FIGS. 6(A)-6(D)) as the bias voltage V continues to rise above the voltage V3 in FIG. 5. Depletion of the first regions 410, 416 leads to the gated-NDR effect. It can be seen in the band diagrams in FIGS. 6(A)-6(D) that, since the XTD operates in the reverse bias direction, thermionic emission paths are eliminated. In addition, the XTD is more robust against trap-assisted tunneling (TAT) than an Esaki tunnel diode since the TAT process needs to absorb energy in the reverse bias operation and is thus less likely to happen as shown in FIG. 6(D). By eliminating the mechanism of thermionic emission and suppressing trap-assisted tunneling (TAT) that produces a second rise in the current I, the valley current $I_{VAL}$ is much lower in the XTD device 400 than in an Esaki tunnel diode, which is a significant reason for the high PVCR.

Without the mechanisms of thermionic emission or trap-assisted tunneling (TAT) to produce a second rise in the current I, the valley current $I_{VAL}$ is much lower in the XTD device 400 than in an Esaki tunnel diode, which is a significant reason for the high PVCR.

Figure 7A:
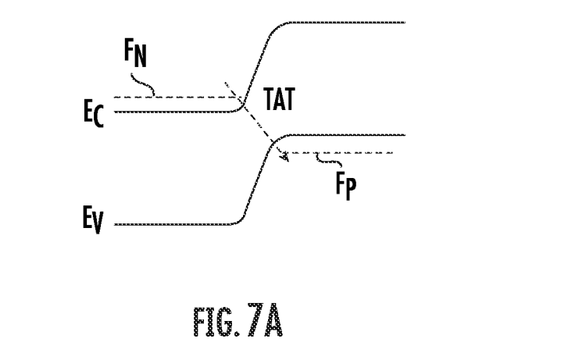
FIGS. 7A and 7B are illustrations of energy bands $E_C$ and $E_V$ of the conduction band electrons and the valence band electrons, respectively, across a P-N junction of an Esaki tunnel diode provided for comparison to the XTD 400.
Figure 7B:
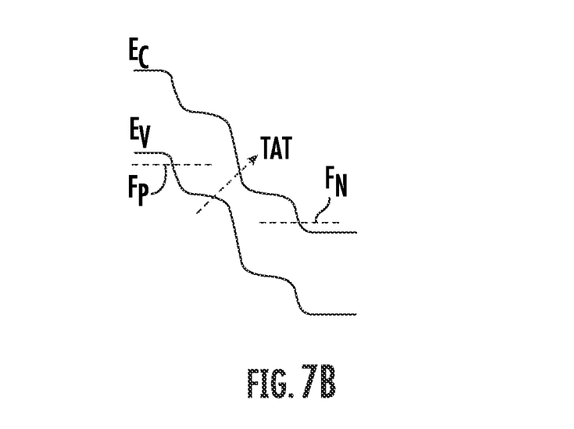

FIGS. 7A and 7B are illustrations of energy bands $E_C$ and $E_V$ of the conduction band electrons and the valence band electrons, respectively, across a P-N junction of an Esaki tunnel diode (FIG. 7A) provided for comparison to the XTD 400 (FIG. 7B) disclosed herein. In the Esaki tunnel diode, the TAT is based on electrons losing energy as they transition from the conduction band to the valence band, which can cause an increase in current. In the XTD 400, however, due to the reverse bias on the P-N junction, electrons would need to absorb energy (increase energy) to make the transition from the valence band to the conduction band. Hence, TAT does not create a significant rise in current in the XTD 400 as found in the Esaki tunnel diode.

Figure 8:
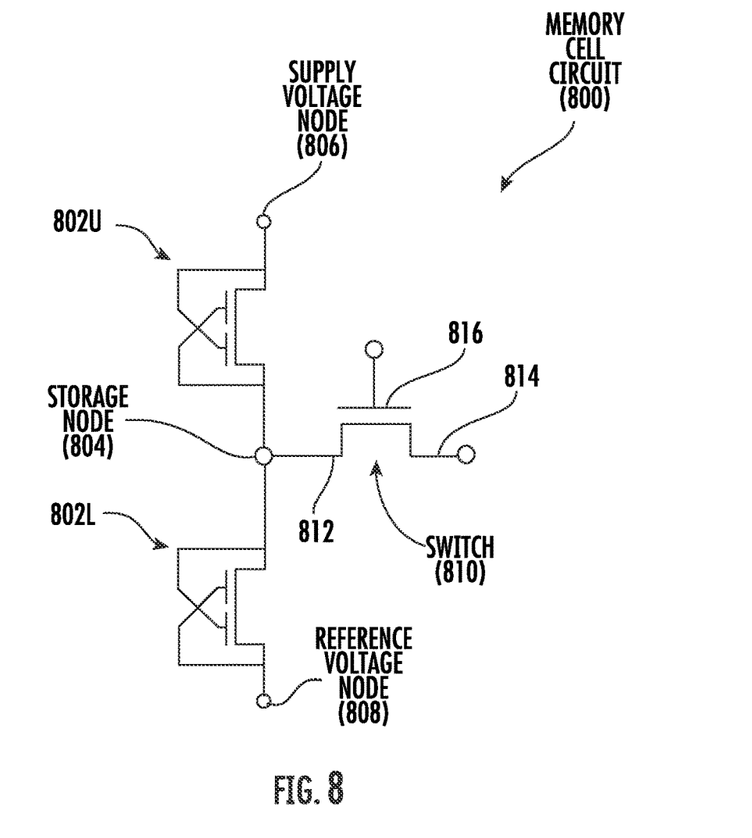
FIG. 8 is a schematic diagram of a memory cell circuit comprising two of the XTD devices in FIG. 4.

FIG. 8 is a schematic diagram of a memory cell circuit 800. Symbols 802U and 802L represented XTD devices 802U and 802L, which each could be the XTD device 400 in FIG. 4. The XTD device 802U is coupled to a storage node 804 and is configured to couple to a supply voltage node 806. The XTD device 802L is coupled to the storage node 804 and configured to couple to a reference voltage node 808. For example, the supply voltage node 806 may be a power rail coupled to a power supply that provides a supply voltage $V_{DD}$ that is at least as high as the voltage V3, or two times the voltage V2, whichever is higher, in FIG. 5. In this example, the reference voltage node 808 may be a ground reference node supplying a reference voltage $V_{SS}$ (e.g., supplying 0 volts). The memory cell circuit 800 also includes a switch 810, including a first terminal 812 coupled to the storage node 804 and a second terminal 814 configured to be coupled to a bit line (not shown). Each of the XTD devices 802U, 802L include the features of the XTD device 400 in FIG. 4. The switch 810 may be implemented with a field-effect transistor (FET), for example. In this regard, the switch 810 includes a gate 816. The switch 810 may be activated and deactivated in response to a voltage on the gate 816. Activating the gate 816 couples a bit line to the storage node 804 to provide a bit line voltage to charge the storage node 804. In a first example, if the storage node 804 is charged to the supply voltage $V_{DD}$ (which is at least V3, or two times the voltage V2, whichever is higher, in FIG. 5), the bias voltage V across the XTD device 802U will be zero volts (V=0). Therefore, no current will be conducted through the XTD device 802U. The bias voltage V across the XTD device 802L in this example is equal to the supply voltage $V_{DD}$, which causes the XTD device to conduct the valley current $I_{VAL}$ that may be 1/1000 to 1/100,000 of the peak current $I_{PK}$.

In a second example of operation of the memory cell circuit 800, the bit line voltage may be the reference voltage $V_{SS}$. In this example, the bias voltage V on the XTD device 802U is equal to the supply voltage $V_{DD}$ and the bias voltage V on the XTD device 802L is 0 volts. Again, neither of the XTD devices 802U and 802L will conduct an appreciable current, so the charge on the storage node 804 will be maintained.

Figure 9:
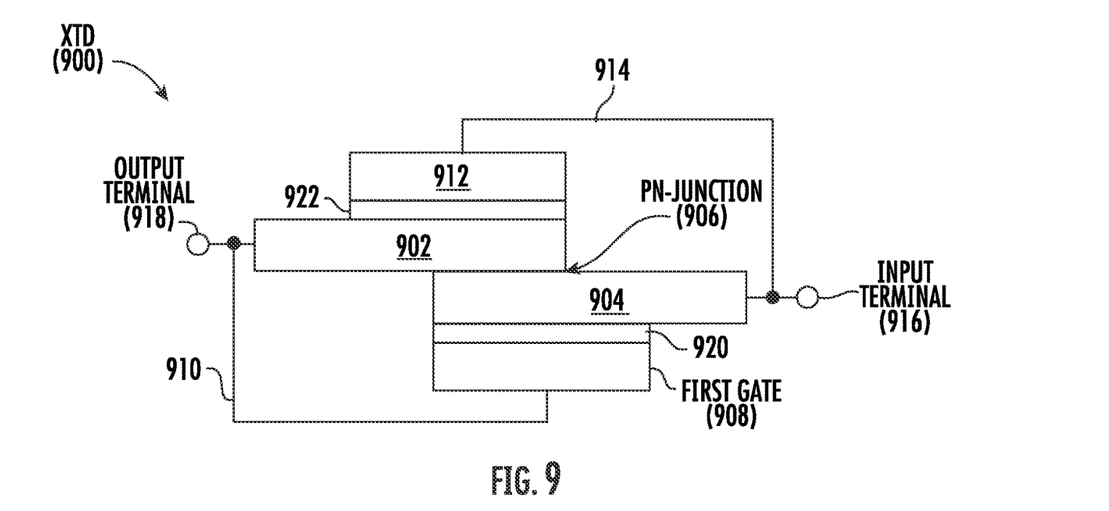
FIG. 9 is a block diagram of a second example of an exemplary XTD device as disclosed herein.

FIG. 9 is a second example of an XTD device 900 that corresponds in function to the XTD device 400 in FIG. 4. As in the XTD device 400, the XTD device 900 includes a P-type semiconductor 902 and an N-type semiconductor 904, and a PN-junction 906 is formed at an intersection of the P-type semiconductor 902 and an N-type semiconductor 904. A first gate 908 is disposed on the N-type semiconductor 904, and a first metal interconnect 910 couples the first gate 908 to the P-type semiconductor 902. A second gate 912 is disposed on the P-type semiconductor, and a second metal interconnect 914 couples the second gate to the N-type semiconductor 904. A conductive material other than metal may be used to form the first and second metal interconnects. An input terminal 916 is coupled to the N-type semiconductor 904, and an output terminal 918 is coupled to the P-type semiconductor 902. A first dielectric layer 920 is disposed between the first gate 908 and the N-type semiconductor 904, and a second dielectric layer 922 is disposed between the second gate 910 and the P-type semiconductor 902. Operation of the XTD device 900 corresponds to the description given above regarding the XTD device 400 and is not repeated here.

The XTD device providing a high PVCR according to aspects disclosed herein may be provided in or integrated into any processor-based device. Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. Memory disclosed herein may be any type and size of memory and may be configured to store any type of information desired, although, as noted, a 6T SRAM is well suited for use with the present disclosure. To illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A tunnel diode device, comprising:
   a P-type semiconductor coupled to an N-type semiconductor;
   a first gate disposed on the N-type semiconductor, the first gate coupled to the P-type semiconductor;
   a second gate disposed on the P-type semiconductor, the second gate coupled to the N-type semiconductor;
   an input terminal directly coupled to the N-type semiconductor; and
   an output terminal directly coupled to the P-type semiconductor.

2. The tunnel diode device of claim 1, further comprising:
   a first dielectric layer between the first gate and the N-type semiconductor; and
   a second dielectric layer between the second gate and the P-type semiconductor;
   wherein the P-type semiconductor coupled to the N-type semiconductor further comprises a PN-junction at an intersection of the N-type semiconductor and the P-type semiconductor.

3. The tunnel diode device of claim 2, wherein:
   the first gate is disposed on a first region of the N-type semiconductor;
   the second gate is disposed on a first region of the P-type semiconductor; and
   the PN-junction is between the first region of the N-type semiconductor and the first region of the P-type semiconductor.

4. The tunnel diode device of claim 3, further comprising:
   a first metal interconnect coupled to the first gate and to a second region of the P-type semiconductor opposite to the first region; and
   a second metal interconnect coupled to the second gate and to a second region of the N-type semiconductor opposite to the first region.

5. The tunnel diode device of claim 4, wherein:
   the input terminal is coupled to an end of the second region of the N-type semiconductor; and
   the output terminal is coupled to an end of the second region of the P-type semiconductor.

6. The tunnel diode device of claim 1, wherein:
   the P-type semiconductor comprises P+ doped germanium; and
   the N-type semiconductor comprises N+ doped silicon.

7. The tunnel diode device of claim 4, wherein:
   each of the P-type semiconductor and the N-type semiconductor comprises:
   a thickness in a first direction in a range of one half (0.5) of a nanometer (nm) to ten (10) nanometers (nm); and
   a length in a second direction in a range from forty (40) nm to sixty (60) nm; and
   each of the first dielectric and the second dielectric comprises a thickness in a range of one (1) nm to eight (8) nm.

8. The tunnel diode device of claim 1, wherein:
   a bias voltage comprises a first voltage on the input terminal higher than a second voltage on the output terminal;
   in response to a first bias voltage, the tunnel diode device conducts a first current from the input terminal to the output terminal;
   in response to a second bias voltage higher than the first bias voltage, the tunnel diode device conducts a second current higher than the first current; and
   in response to a third bias voltage higher than the second bias voltage, the tunnel diode device conducts a third current less than the second current.

9. The tunnel diode device of claim 8, wherein a ratio of the second current to the third current is at least $10^3$ (1000).

10. The tunnel diode device of claim 8, wherein in response to the tunnel diode device operating at a temperature range up to one hundred degrees Celsius (100° C.), a ratio of the second current to the third current is at least $10^4$ (10,000).

11. The tunnel diode device of claim 8, wherein a ratio of the second current to the third current is at least $1\times10^5$ (100,000).

12. The tunnel diode device of claim 7, wherein the P-type semiconductor and the N-type semiconductor each extend along an axis extending in the second direction.

13. The tunnel diode device of claim 7, wherein the P-type semiconductor and the N-type semiconductor are stacked are stacked in the first direction.

14. The tunnel diode device of claim 1 integrated into an integrated circuit (IC).

15. A memory cell circuit, comprising:
   a first tunnel diode circuit coupled to a storage node and configured to couple to a supply voltage node;
   a second tunnel diode circuit coupled to the storage node and configured to couple to a reference voltage node; and
   a switch coupled to the storage node and configured to couple to a bit line;
   wherein, each of the first tunnel diode circuit and the second tunnel diode circuit comprises:
   a P-type semiconductor coupled to an N-type semiconductor;
   a first gate disposed on the N-type semiconductor, the first gate coupled to the P-type semiconductor;
   a second gate disposed on the P-type semiconductor, the second gate coupled to the N-type semiconductor;
   an input terminal directly coupled to the N-type semiconductor; and
   an output terminal directly coupled to the P-type semiconductor.

16. The memory cell circuit of claim 15, wherein:
   the input terminal of the first tunnel diode circuit is coupled to the supply voltage node;
   the output terminal of the first tunnel diode circuit is coupled to the storage node;
   the input terminal of the second tunnel diode circuit is coupled to the storage node; and the output terminal of the second tunnel diode circuit is coupled to the reference voltage node.

17. The memory cell circuit of claim 16, each of the first tunnel diode circuit and the second tunnel diode circuit further comprising:
a first dielectric layer between the first gate and the N-type semiconductor;
a second dielectric layer between the second gate and the P-type semiconductor;
the N-type semiconductor comprises a first surface; and
the P-type semiconductor comprises a second surface coupled to the first surface to form a PN-junction.

18. The memory cell circuit of claim 17, wherein in each of the first tunnel diode circuit and the second tunnel diode circuit:
the first surface of the N-type semiconductor is in a first region of the N-type semiconductor;
the second surface of the P-type semiconductor is in a first region of the P-type semiconductor;
the first gate is disposed on the first region of the N-type semiconductor adjacent to the first surface; and
the second gate is disposed on the first region of the P-type semiconductor adjacent to the second surface.

19. The memory cell circuit of claim 18, each of the first tunnel diode circuit and the second tunnel diode circuit further comprising:
a first metal interconnect coupled to the first gate and to a second region of the P-type semiconductor; and
a second metal interconnect coupled to the second gate and to a second region of the N-type semiconductor.

20. The memory cell circuit of claim 19, wherein in each of the first tunnel diode circuit and the second tunnel diode circuit:
the input terminal is coupled to the second region of the N-type semiconductor; and
the output terminal is coupled to the second region of the P-type semiconductor.

21. The memory cell circuit of claim 15, configured to, in response to the switch being activated to couple the bit line to the storage node, and the bit line comprising a bit line voltage comprising one of a supply voltage on the supply voltage node and a reference voltage on the reference voltage node, storing the bit line voltage on the storage node.

* * * * *

UNITED STATES PATENT AND TRADEMARK OFFICE
CERTIFICATE OF CORRECTION

| | | |
|---|---|---|
| PATENT NO. | : 12,080,808 B2 | Page 1 of 1 |
| APPLICATION NO. | : 17/690417 | |
| DATED | : September 3, 2024 | |
| INVENTOR(S) | : Peng Wu and Joerg Appenzeller | |

It is certified that error appears in the above-identified patent and that said Letters Patent is hereby corrected as shown below:

In the Claims

In Column 10, Lines 36 and 37, Claim 13, replace "are stacked are stacked" with --are stacked--.

Signed and Sealed this
Eighth Day of October, 2024

Katherine Kelly Vidal
*Director of the United States Patent and Trademark Office*